(12) United States Patent
Tosiya

(10) Patent No.: US 7,345,865 B2
(45) Date of Patent: Mar. 18, 2008

(54) MAGNETIC GUIDING APPARATUS

(75) Inventor: Asano Tosiya, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 160 days.

(21) Appl. No.: 10/830,004

(22) Filed: Apr. 23, 2004

(65) Prior Publication Data
US 2004/0227474 A1    Nov. 18, 2004

(30) Foreign Application Priority Data
May 15, 2003    (JP)    ............................. 2003-137304

(51) Int. Cl.
*H01F 13/00* (2006.01)
(52) U.S. Cl. ..................................... 361/267
(58) Field of Classification Search ................. 361/267
See application file for complete search history.

(56) References Cited

U.S. PATENT DOCUMENTS

| | | | |
|---|---|---|---|
| 5,227,948 A * | 7/1993 | Boon et al. .................. | 361/144 |
| 2002/0121615 A1* | 9/2002 | Nakasuji ................. | 250/492.22 |
| 2003/0043486 A1* | 3/2003 | Nakamura et al. ............ | 360/17 |
| 2005/0229690 A1* | 10/2005 | Kikuchi et al. ................ | 73/146 |

FOREIGN PATENT DOCUMENTS

| | | | |
|---|---|---|---|
| JP | 02-295889 | * | 12/1990 |
| JP | 4-245406 | | 9/1992 |
| JP | 9-68221 | | 3/1997 |
| JP | 10-244-566 | * | 9/1998 |
| JP | 3145355 | | 1/2001 |
| KR | 2001065114 A | * | 7/2001 |

* cited by examiner

*Primary Examiner*—Michael Sherry
*Assistant Examiner*—Ann T. Hoang
(74) *Attorney, Agent, or Firm*—Fitzpatrick, Cella, Harper & Scinto

(57) ABSTRACT

A magnetic guiding apparatus guides a moving member by attracting a target with electromagnets provided on the moving member. The magnetic guiding apparatus has a magnetic-flux detection device movable along the target to detect magnetic flux of the target and a position measuring unit measures the position of the magnetic-flux detection device. A control unit detects the position of magnetic flux in the target from the position information obtained by the position measuring unit and the magnetic-flux information obtained from the magnetic-flux detection device and performs demagnetization at the detected magnetic flux position.

13 Claims, 11 Drawing Sheets

MAGNETIC GUIDING APPARATUS

BACKGROUND OF THE INVENTION

1. Field of the Invention

The present invention relates to a magnetic guiding apparatus for exposure apparatus utilized in manufacturing devices, such as semiconductor devices, liquid-crystal display devices, and the like, and inspection apparatus, or the like, in which a stage mounting an original plate, such as a mask, a reticle, or the like, or a substrate to be exposed or inspected, such as a semiconductor wafer, a glass substrate, or the like, is moved by a magnetic guide.

2. Description of the Related Art

An exposure apparatus utilized in a process for manufacturing devices, such as semiconductor devices, liquid-crystal display devices, or the like, has stage apparatus for moving a substrate to be exposed, for example, an original plate, such as a mask, a reticle, or the like, or a substrate to be exposed, such as a semiconductor wafer, a glass substrate, or the like.

Such a stage apparatus is disclosed, for example, in Japanese Patent Publication No. 3145355. In this stage device, a Y stage is guided by a yaw guide and is mounted on a stage surface plate. An air pad is provided between the Y stage and the stage surface plate and the yaw guide.

An X slider is provided so as to surround a Y slider connected to the Y stage. An air pad is provided between a side of the Y slider and a side of the X slider. An air pad is also provided between the X slider and the stage surface plate. According to such a structure, since the Y slider is slidable in the y direction and the X slider is slidable with respect to the Y slider in the x direction, the X slider is slidable both in the x and y directions.

A magnetic guiding apparatus using an electromagnet is disclosed, for example, in Japanese Patent Application Laid-Open (Kokai) No. 04-245406 (1992). A method for removing remanence is disclosed, for example, in Japanese Patent Application Laid-Open (Kokai) No. 09-068221 (1997), which discloses AC demagnetization in which demagnetization is performed by causing an AC current to flow in an electromagnet and gradually reducing the magnitude of the current from a maximum current to zero.

In the stage described in Japanese Patent Publication No. 3145355, transmission of a force by an air pad is only about 1 kgf/cm$^2$ as a value converted into pressure. Accordingly, it is estimated that when, for example, a force to be transmitted to the X slider increases by adding a fine-movement stage, the value of the force exceeds the capability of force transmission by the air pad.

If the air pad is replaced by a rolling guide, the problems of a short life and dust arise, particularly, in an apparatus in which long-time continuous operation and a high-degree of cleanness are required, such as in an exposure apparatus.

In order to solve the above-described problems, an approach of utilizing a magnetic guide using an electromagnet disclosed in Japanese Patent Application Laid-Open (Kokai) No. 04-245406 (1992) instead of the air pad disclosed in Japanese Patent Publication No. 3145355 may be adopted. This configuration can improve the force transmission capability. Furthermore, since silicon steel having little magnetic hysteresis can be used as the material for the electromagnet and the target, the electromagnet and the target are hardly magnetized under ordinary control conditions.

However, in runaway of the electromagnet caused by an unintended accident, an excessive magnetic flux may pass through the target, resulting in an increase of remanence. The runaway of the electromagnet indicates a case in which a desired servo is not applied to the stage. This happens, for example, when a current driver fails, or when a large current passes through a driving coil for the electromagnet caused by a software bug, or the like. The generated remanence operates as a disturbance for an X-slider control system, resulting in degradation in the accuracy of subsequent positioning.

A method for solving the problem of remanence is disclosed, for example, in Japanese Patent Application Laid-Open (Kokai) No. 09-068221 (1997). However, in a stage apparatus, since the positional relationship between the electromagnet and the target is movable, the position of a magnetic flux at the target is unknown, thereby causing a problem in efficiency if demagnetization is performed over the entire region of the target.

SUMMARY OF THE INVENTION

The present invention has been made in consideration of the above-described problems.

It is an object of the present invention to perform efficient demagnetization in a magnetic guiding apparatus for guiding a moving member by attracting a target to an electromagnet provided at the moving member, by detecting the position of a magnetic flux at the target.

According to one aspect of the present invention, a magnetic guiding apparatus for guiding a moving member by attracting a target to an electromagnet provided at the moving member includes a magnetic-flux detection unit movable along the target, for detecting a magnetic flux of the target, a position measuring unit for measuring a position of the magnetic-flux detection unit, and a control unit for detecting a position of the magnetic flux at the target from position information obtained by the position measuring unit and magnetic-flux information obtained from the magnetic-flux detection unit, and for performing demagnetization at the position of the magnetic flux.

According to another aspect of the present invention, a stage apparatus includes the above-described magnetic guiding apparatus.

According to still another aspect of the present invention, an exposure apparatus positions at least one of a substrate and an original by the above-described stage apparatus.

According to yet another aspect of the present invention, a device manufacturing method includes a step of manufacturing devices by the above-described exposure apparatus.

According to yet a further aspect of the present invention, a magnetic guiding apparatus for guiding a moving member by attracting a target to an electromagnet provided at the moving member includes a magnetic-flux detection unit provided at the moving member, for detecting a magnetic flux of the target, a position measuring unit for measuring a position of the moving member, and a control unit for detecting a position of the magnetic flux at the target from position information obtained by the position measuring unit and magnetic-flux information obtained from the magnetic-flux detection unit, and for performing demagnetization by moving the electromagnet to the position of the magnetic flux by the moving member and providing the electromagnet with a current signal from the control unit.

The foregoing and other objects, advantages and features of the present invention will become more apparent from the following detailed description of the preferred embodiments taken in conjunction with the accompanying drawings.

DETAILED DESCRIPTION OF THE PREFERRED EMBODIMENTS

First Embodiment

Figure 1:
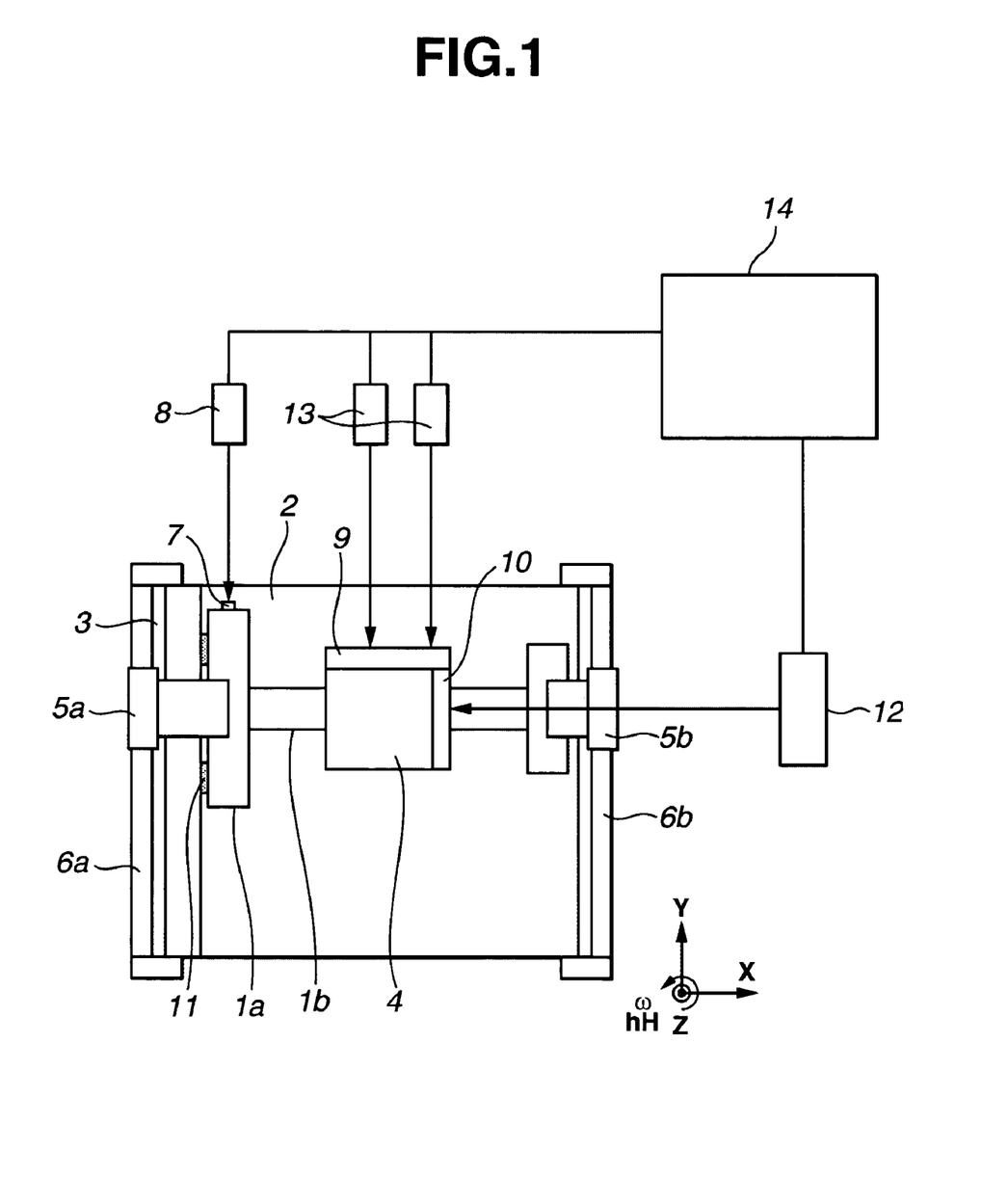
FIG. 1 is a diagram illustrating the configuration of a stage using a magnetic guide according to the present invention.

FIG. 1 illustrates a stage apparatus mounting a magnetic guiding apparatus according to the present invention. A Y stage 1a and a Y slider 1b fixed thereto are supported on a surface plate 2 by a hydrostatic guide (not shown). The Y stage 1a is supported by a hydrostatic guide 11 with respect to a yaw guide 3 so as to be movable in the Y direction. An X slider 4, serving as a moving member, is provided so as to surround the Y slider 1b, and the weight of the X slider 4 is supported on the surface plate 2 by a hydrostatic guide (not shown) provided at the base of the X slider 4.

Y-linear-motor rotors 5a and 5b, each made of a permanent magnet (not shown), are provided at the left and the right (respective end portions in the X direction) of the Y slider 1b, and Y-linear-motor stators 6a and 6b, each made of a multiphase coil (not shown), are provided at the left and the right (respective end portions in the X direction) of the surface plate 2, respectively. By causing an appropriate current to flow in the coil, a thrust can be generated for a Y linear motor. Similarly, an X-linear-motor rotor (not shown) and an X-linear-motor stator are provided at the X slider 4 and the Y slider 1b, respectively, so that a thrust can be generated for the X slider 4 with respect to the Y slider 1b in the X direction.

A Y-stage interferometer mirror 7 is provided at the Y stage 1a, and the Y-direction position of the Y slider 1b is measured by a laser interferometer 8, serving as position measuring unit. Similarly, bar-shaped Y-interferometer mirror 9 and X-interferometer mirror 10 are provided at the X slider 4. The X-direction position and the Y-direction position of the X slider 4 are measured by an X laser interferometer 12 and a Y laser interferometer 13, respectively.

The Y laser interferometer 13 has two laser beams, and the displacement of the X slider in a ωz direction (a direction of rotation around the z axis) is measured from measured values by the two beams and a span between the two beams in the X direction.

Figure 2:
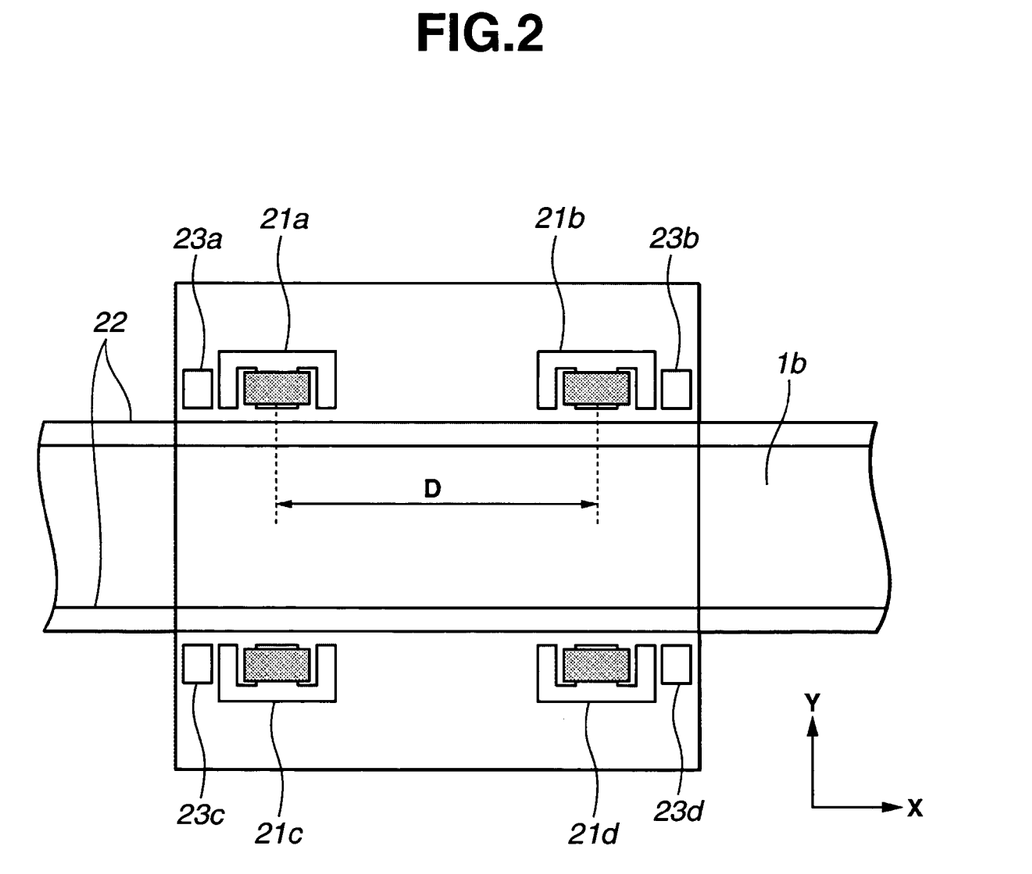
FIG. 2 is a diagram illustrating the configuration of a magnetic guide according to a first embodiment of the present invention.

FIG. 2 illustrates the configuration of a magnetic guide for the X slider 4. Electromagnets 21a, 21b, 21c and 21d are provided at the X slider 4. A driving coil is mounted around an E core obtained by laminating E-shaped steel plates at each of the electromagnets 21a, 21b, 21c and 21d. By causing an appropriate current to flow in each of the driving coils, a thrust in the Y direction and in the ωz direction can be generated for the X slider 4.

Each pair of the electromagnets 21a and 21c, and the electromagnets 21b and 21d are provided so as to face each other across the Y slider 1b having targets 22 at both sides. The electromagnets 21a and 21b are arranged at one side of the Y slider 1b with a predetermined distance D in the X direction, and the electromagnets 21c and 21d are arranged at another side of the Y slider 1b with the same distance D.

The electromagnets 21a and 21b operate on the target 22 provided at one side of the Y slider 1b, and the electromagnets 21c and 21d operate on the target 22 provided at another side of the Y slider 1b, to move the X slider 4 in the X direction along the Y slider 1b, and allow displacement of the X slider 4 in the ωz direction. For example, silicon steel having little magnetic hysteresis may be used as the material for the targets and the electromagnets.

According to the above-described configuration, the X slider 4 can be subjected to positioning control in the X direction, the Y direction and the ωz direction by a control system 14, based on position information obtained from the position measuring unit.

When control for the X slider 4 normally operates, remanence is not generated in the electromagnets 21a-21d and the targets 22. However, if the X slider 4 runs away, a large magnetic flux is generated in the electromagnets 21a-21d and the targets 22, thereby sometimes causing magnetization. Furthermore, in the case of runaway, the laser interferometer is often broken due to speed error, or the like, and the position at which the X slider 4 has run away cannot be known. A mechanism for identifying and demagnetizing a magnetized portion will now be described.

In FIG. 2, magnetic-flux detection units 23a-23d are provided at the X slider 4 at respective portions outside of the electromagnets 21a-21d in the X direction, respectively. The distance between the magnetic-flux detection units and the electromagnets will be described later.

Figure 4:
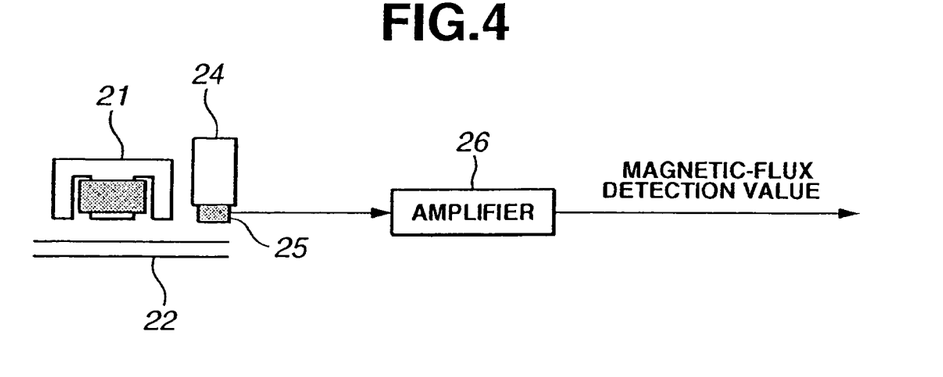
FIG. 4 is a diagram illustrating a magnetic-flux detection system using a Hall element.

FIG. 4 is a diagram illustrating a magnetic-flux detection system in which a Hall element 25 is used as the magnetic-flux detection units. The magnetic flux of the target 22 is detected by the Hall element 25 mounted on a mount 24, and a detection signal from the Hall element 25 is output after being amplified by an amplifier 26.

Figure 5:
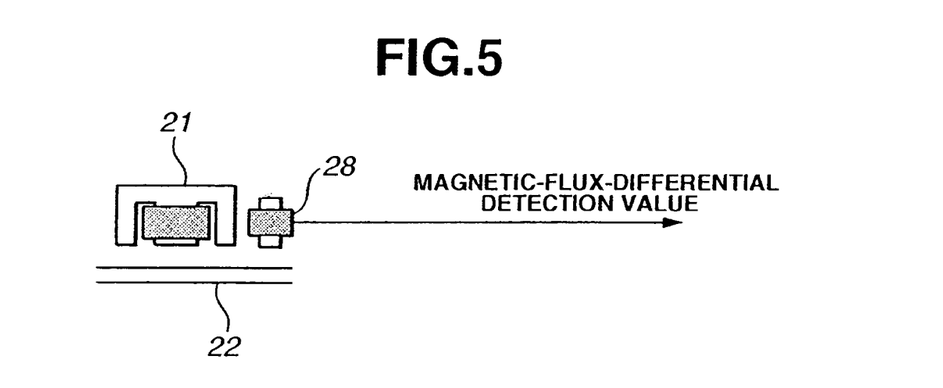
FIG. 5 is a diagram illustrating a magnetic-flux detection system using a search coil.

FIG. 5 is a diagram illustrating a magnetic-flux detection system in which a search coil 28 is used as the magnetic-flux detection units. In the magnetic-flux detection system shown in FIG. 5, time variation, i.e., differential, of a magnetic flux is detected as a detection value.

Figure 6:
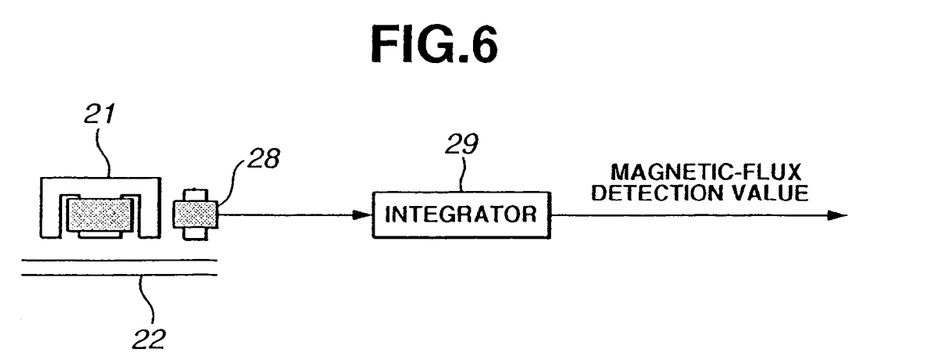
FIG. 6 is a diagram illustrating a magnetic-flux detection system using a search coil and an integrator.

FIG. 6 illustrates a system in which a search coil 28 is used as in the case of FIG. 5, and sensitivity is improved by integrating the voltage of the search coil 28 by an integrator 29. When the voltage of the search coil 28 is integrated with respect to time by the integrator 29, a magnetic-flux component is obtained as an output. The magnetic-flux detection units is not limited to the Hall element or the search coil described above. Any other appropriate device, such as a magnetoresistance element or the like, may also be used.

Figure 7:
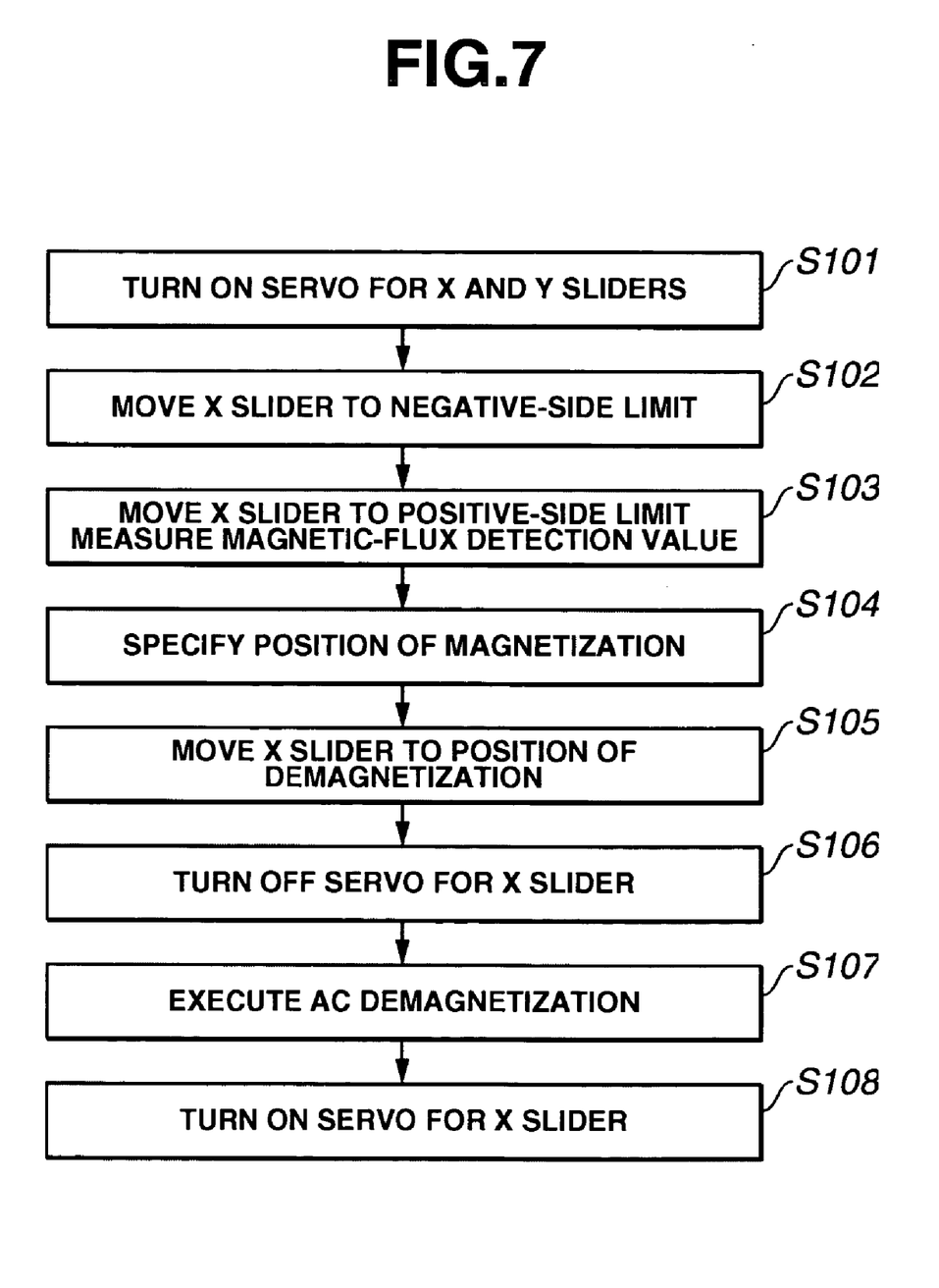
FIG. 7 is a flowchart illustrating a demagnetizing process in the magnetic guide of the first embodiment.

FIG. 7 is a flowchart illustrating identification of a magnetized portion, and a demagnetization method. First, a position servo is provided for the X slider 4 and the Y slider 1b according to an ordinary operation (step S101). Then, the X slider 4 is moved to an end of a stroke range movable in the X direction (hereinafter termed a "negative-side limit") (step S102). In this step, a state in which a magnetic flux can be detected is provided by turning on the magnetic-flux detection unit 23. Then, the X slider 4 is moved to another end of the movable stroke range opposite to the end in step S101 (hereinafter termed a "positive-side limit", step S103).

Figure 8:
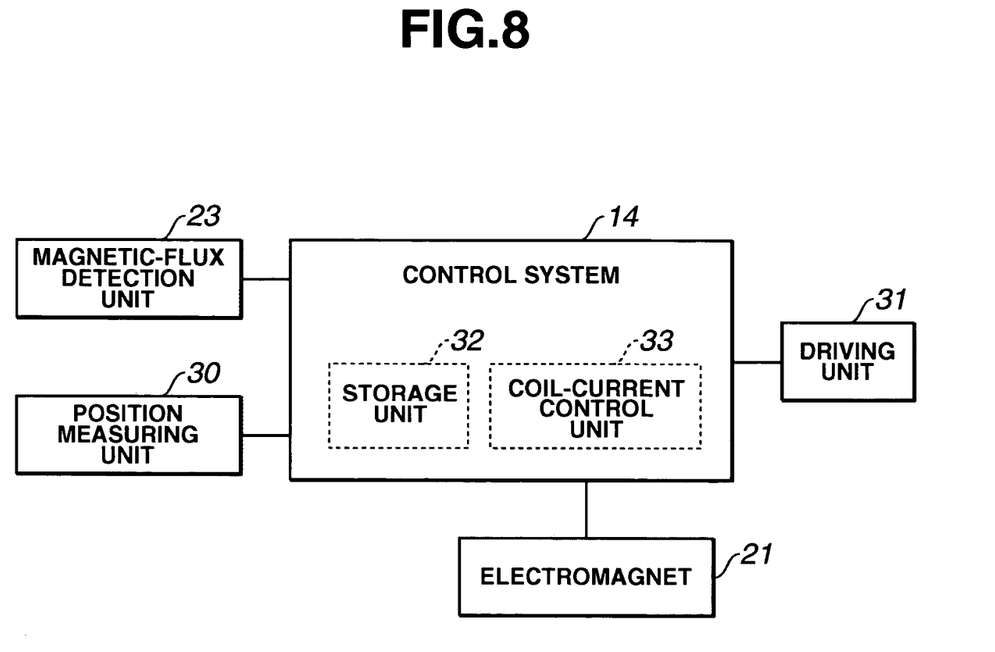
FIG. 8 is a block diagram illustrating a control system of the first embodiment.

Identification of a magnetized position in step S104 will now be described. Values measured by the magnetic-flux detection unit 23 during movement in step S103 are stored in a storage unit 32 (see FIG. 8) together with position information of the X slider 4 in the X direction measured by position measuring unit 30. The position measuring unit 30 corresponds to the laser interferometer 12.

Figure 10:
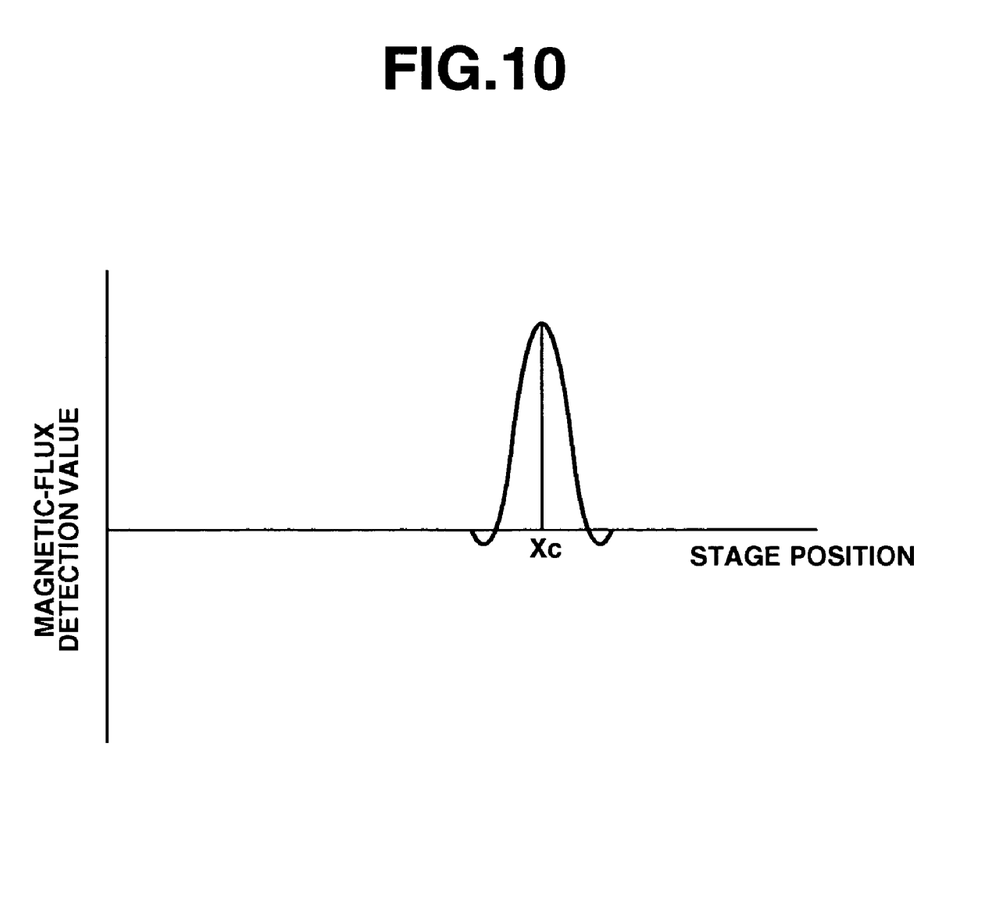
FIG. 10 is a graph illustrating a detected magnetic flux.

By plotting magnetic-flux detection values measured by the magnetic-flux detection unit 23 provided, for example, at a portion near the electromagnet 21 with respect to the position information of the X slider 4 in the X direction, a graph shown in FIG. 10 is obtained. In FIG. 10, magnetic-flux detection values measured by the magnetic-flux detection means 23 have a peak value at a stage-position coordinate Xc that is measurement information from the laser interferometer 12. This indicates that this portion of the target 22 is magnetized. The position coordinate Xc is a value obtained when the magnetic-flux detection units 23 is positioned at the magnetized position of the target 22.

Figure 9:
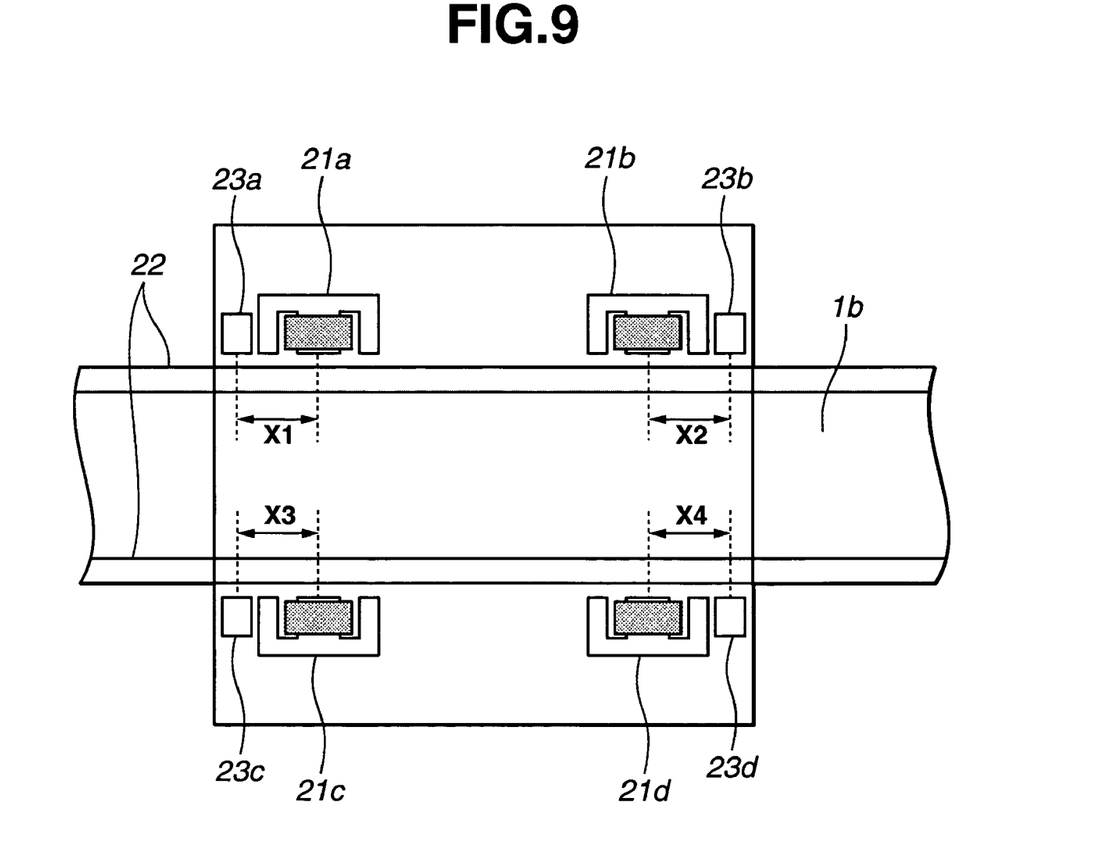
FIG. 9 is a diagram illustrating positions of magnetic-flux detection systems according to the first embodiment.

When the magnetized position is identified in step S104, the X slider 4 is moved to that position by a driving unit 31 (step S105). Although the driving unit 31 includes an X linear motor (not shown) and Y linear motors 5 and 6, an X linear motor is assumed in this case. As shown in FIG. 9, offsets X1, X2, X3 and X4 are present between the electromagnets 21a-21d and the magnetic-flux detection units 23a-23d, respectively. When performing demagnetization, in the case of the electromagnet 21a, the position of the stage is moved to a position of Xc−X1, so that the electromagnet 21a faces the magnetized position. Similarly, in the cases of the electromagnets 21c, 21b, and 21d, the position of the stage is moved to positions of Xc−X3, Xc+X2, and Xc+X4, respectively.

When performing demagnetization, since the efficiency is higher as the gap between the electromagnet 21 and the target 22 is smaller, the X slider 4 is moved so as to minimize the gap, and servo for the X slider 4 is stopped (step S106). This is because, when a large current is caused to flow in order to perform demagnetization and a large attractive force is thereby generated between the electromagnet 21 and the target 22, this force cannot be suppressed by servo, and therefore servo must be interrupted. When the servo is interrupted, the X slider 4 must be fixed by interrupting air supply to the hydrostatic guide at the base of the X slider 4 in order to maintain the position.

Figure 3:
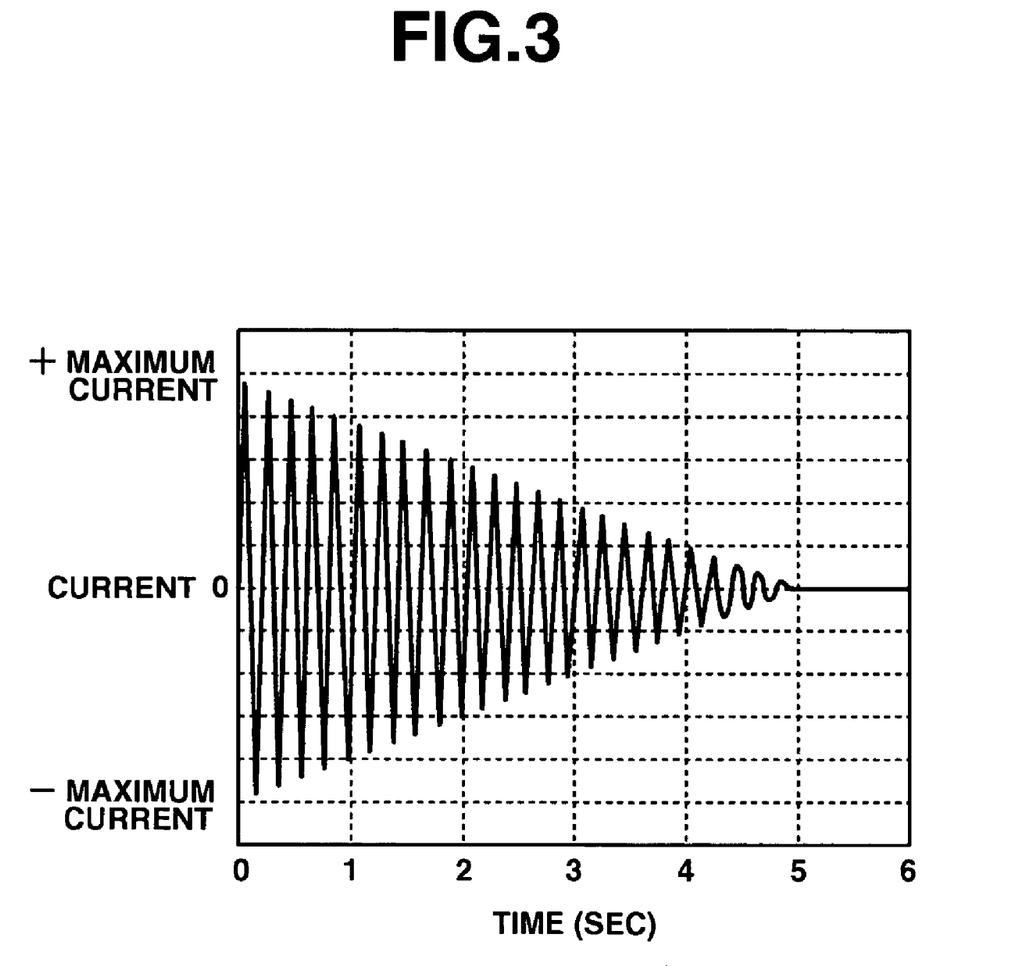
FIG. 3 is a graph illustrating a demagnetizing current.

Demagnetization is performed by causing an AC current shown in FIG. 3 to flow in a driving coil (not shown) of the electromagnet 21 by a coil-current control unit 33 (see FIG. 8) (step S107). Although in the demagnetizing current shown in FIG. 3, the amplitude of the current is linearly decreased, the amplitude of the current may also be exponentially decreased. A higher frequency may also be used. In short, any current that can remove remanence by gradually decreasing the curve of hysteresis may be used. Upon completion of demagnetization, ordinary servo positioning for the X slider 4 is performed in order to return to an ordinary operation (step S108).

The present invention is not limited to the flowchart shown in FIG. 7. For example, although in the first embodiment, demagnetization is performed by moving the X slider 4 to the magnetized position after identifying the position of the magnetic flux, i.e., the magnetized position, in the entire region of the target by moving the X slider 4 from the negative limit to the positive limit, demagnetization may also be performed by detecting the position of the magnetic flux and then immediately moving demagnetizing means to the detected position of the magnetic flux.

Although in the stage configuration of the first embodiment, in order to control two axes in total, i.e., one axis for parallel movement and one axis for rotation, in an electromagnetic actuator (not shown, consisting of the electromagnet 21 and the target 22), two facing pairs of electromagnets are required, one pair of electromagnets may suffice when controlling only one axis for parallel movement by an electromagnetic actuator.

Although in the first embodiment, four magnetic-flux detection units in total are provided at outer sides of respective electromagnets in the Y direction, at least one magnetic-flux detection unit may suffice for one target provided that a magnetic flux can be detected within a range of capability of magnetization. Furthermore, magnetic-flux detection means may be provided at a moving member separately from the X slider 4, provided that a magnetic flux can be detected in a state of being movable along the guiding direction of the target.

Although in the first embodiment, the position of a moving member is measured, and the position of magnetic-flux detection unit is measured based on a known offset value using the measured value, a mechanism that can directly measure the position of magnetic-flux detection unit may also be used. Means for measuring the position of a moving member has a function substantially equivalent to the function of position measuring means of magnetic-flux detection units.

Second Embodiment

Figure 11:
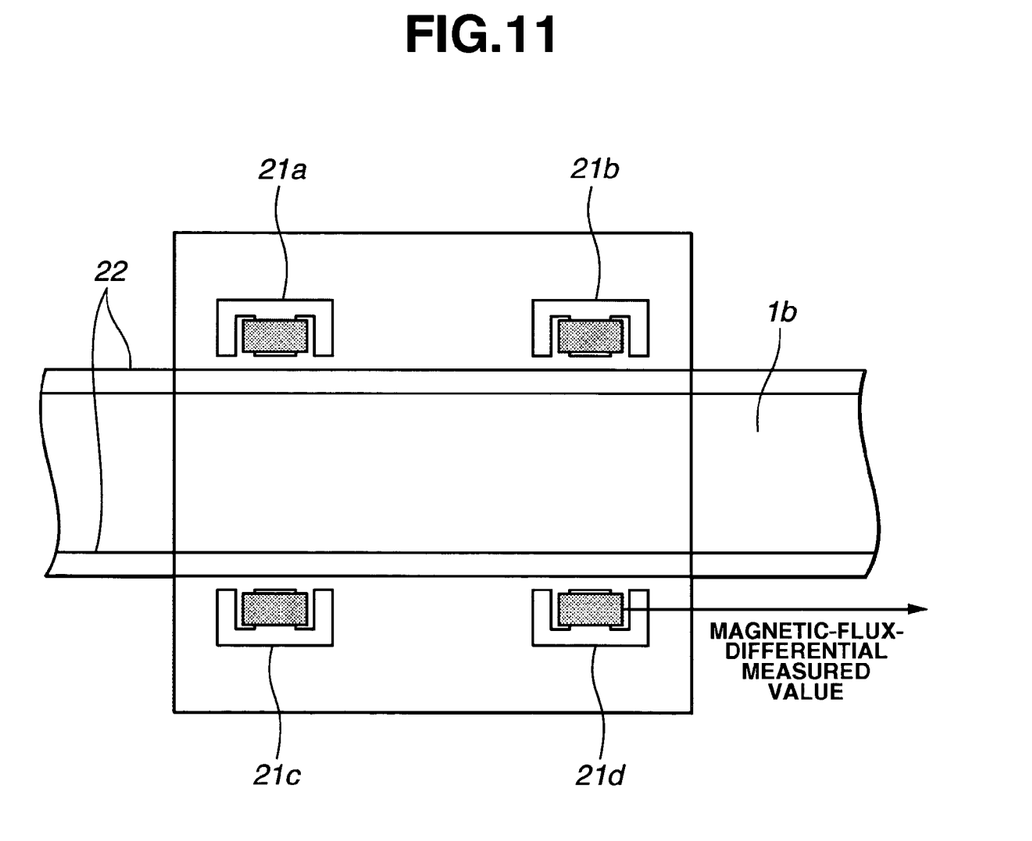
FIG. 11 is a diagram illustrating a second embodiment of the present invention.

FIG. 11 illustrates a second embodiment of the present invention. The configuration of the stage and the electromagnet is entirely the same as in the configuration shown in FIG. 1. Ordinary servo positioning is performed for the X slider 4 and the Y slider 1b, and the X slider 4 is moved to the negative-side limit.

The servo system including the four electromagnets is replaced by a configuration using three electromagnets 21a-21c. Servo positioning in the Y direction and the ωz direction can be performed if three electromagnets are present, although the efficiency is inferior to the configuration using four electromagnets, and an extra force is required. However, since movement in the Y direction is not performed in a series of demagnetizing operations, no problem arises.

At that time, since the electromagnet 21d is not used, the electromagnet 21d itself can be used as magnetic-flux detection unit. That is, the driving coil of the electromagnet 21d can be used as a search coil shown in FIG. 5. A search coil separate from the driving coil may be provided in the electromagnet 21d, and the same configuration as the magnetic-flux detection units in the first embodiment may be adopted.

In this state, the X slider 4 is driven to the positive-side limit, and a magnetic-flux detection value obtained by the electromagnet 21d is stored together with position information relating to the X slider 4. At that time, the search coil of the electromagnet 21d is influenced by the magnetic flux of the electromagnet 21c. However, since this component is very small compared with influence of magnetization, no problem arises. The position of a portion of the target magnetized by the electromagnet 21d can be detected based on the above-described information.

Thereafter, demagnetization may be performed in the above-described manner. One of the electromagnets 21a-21c may also be used as magnetic-flux detection means by being removed from the position servo system. In this case, although the number of operations increases, it is unnecessary to newly provide magnetic-flux detection unit 23 above the X slider 4. This is advantageous for reducing the size and the weight of the apparatus.

When at least five electromagnets are used, also, the same effects may be obtained if an electromagnet that is not used for the servo positioning system is used as magnetic-flux detection means 23.

In the first embodiment, by using the same magnet for magnetic-flux detection means and demagnetizing means, demagnetization can be performed without moving when the position of a magnetic flux is detected. In this case, position information is utilized for maintaining an electromagnet used for detection of a magnetic flux and demagnetization at the same position.

Third Embodiment

Figure 12:
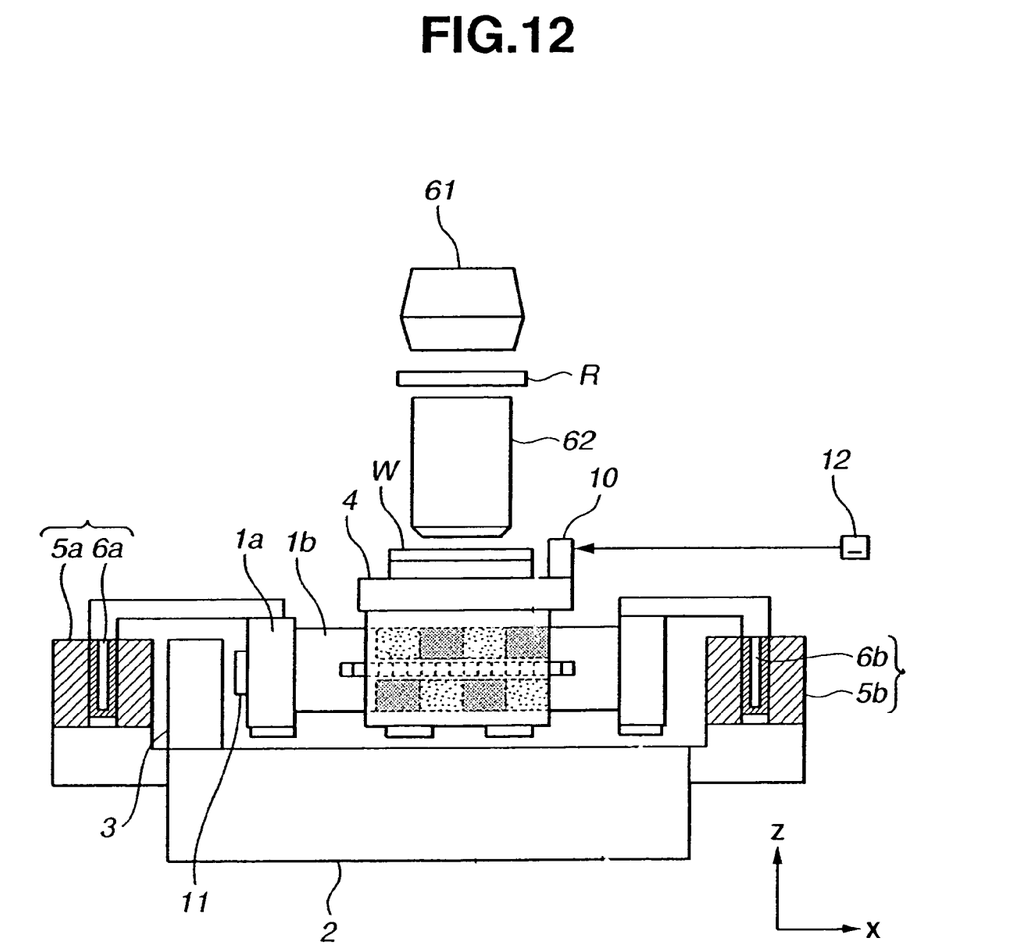
FIG. 12 is a diagram illustrating an exposure apparatus according to a third embodiment of the present invention.

FIG. 12 illustrates an exposure apparatus for manufacturing semiconductor devices in which a stage apparatus mounting a magnetic guide according to the present invention is used as a wafer stage.

This exposure apparatus is utilized for manufacturing semiconductor devices, such as semiconductor integrated circuits, or the like, and devices having fine patterns formed thereon, such as micromachines, thin-film magnetic heads, or the like. In the exposure apparatus, a desired pattern is formed on a substrate by projecting exposing light (a generic term for visible light, ultraviolet light, EUV light, X-rays, an electron beam, a charged particle beam, and the like), serving as exposing energy, from a light source 61 onto a semiconductor wafer W, serving as a substrate, via a reticle R, serving as an original plate, through a projection lens (a generic term for a dioptric lens, a reflecting lens, a reflecting dioptric lens system, a charged-particle lens, and the like) 62, serving as a projection system.

The wafer W, serving as a substrate, is held on a chuck mounted on a moving stage 4, and a pattern on the reticle R, serving as an original plate, is subjected to reduction transfer onto each region on the wafer W using the light source 61 and the projection optical system 62 according to a step-and-repeat approach or a step-and-scan approach.

Figure 13:
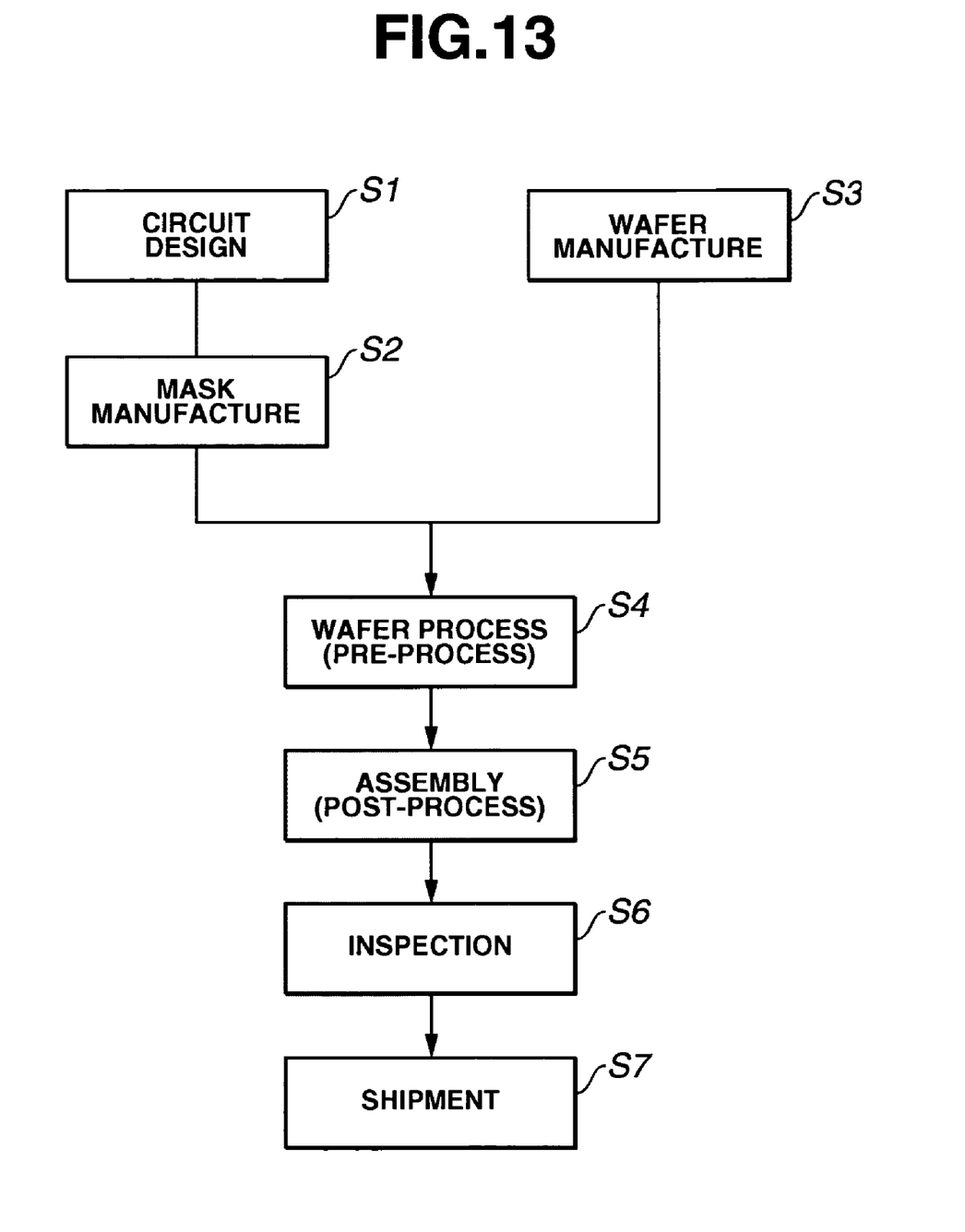
FIG. 13 is a diagram illustrating the flow of a manufacturing process for the exposure apparatus shown in FIG. 12.

Next, a description will be provided of a semiconductor-device manufacturing process utilizing this exposure apparatus. FIG. 13 is a flowchart illustrating the overall semiconductor-device manufacturing process.

In step 1 (circuit design), circuit design of semiconductor devices is performed. In step 2 (mask manufacture), masks are manufactured based on the designed circuit pattern.

In step 3 (wafer manufacture), wafers are manufactured using a material, such as silicon, or the like. Step 4 (wafer process) is called pre-process, in which actual circuits are formed on the wafers by means of lithography by the exposure apparatus using the above-described masks and wafers. The next step 5 (assembly) is called a post-process, which manufactures semiconductor chips using the wafers processed in step 4, and includes an assembling process (dicing and bonding), a packaging process (chip encapsulation), and the like. In step 6 inspection, operation confirming tests, durability tests, and the like for the semiconductor devices manufactured in step 5 are performed. The manufacture of the semiconductor devices is completed after passing through these processes, and the manufactured devices are shipped in step 7.

The above-described wafer process of step 4 has the following steps, i.e., an oxidation step in which the surface of the wafer is oxidized, a CVD (chemical vapor deposition) step in which an insulating film is formed on the surface of the wafer, an electrode forming step in which electrodes are formed on the surface of the wafer by vacuum deposition, an ion implantation step in which ions are implanted into the wafer, a resist process step in which a photosensitive material is coated on the wafer, an exposure step in which the circuit pattern is transferred onto the wafer after the resist process step using the exposure apparatus, a developing step in which the wafer exposed in the exposing step is developed, an etching step in which portions other than the resist image developed in the developing step is etched off, and a resist separation step in which the resist that becomes unnecessary after the completion of the etching is removed. By repeating these steps, a final circuit pattern made of multiple patterns is formed on the wafer.

According to the present invention, in a magnetic guiding apparatus for guiding a moving member by attracting a target by an electromagnet provided in the moving member, it is possible to perform efficient demagnetization by detecting the position of a magnetic flux in the target.

By identifying a magnetized position in the target by moving magnetic-flux detection means in the entire movable region on the target while detecting a magnetic flux by the magnetic-flux detection unit and storing position information and magnetic-flux information of the target, the position of a magnetic flux, i.e., the magnetized position, in the entire region of the target can be exactly identified.

By mounting the magnetic-flux detection means on the moving member, it is unnecessary to separately provide a mechanism for moving the magnetic-flux detection means. Hence, this approach is advantageous from the viewpoint of the cost and the space.

By moving the electromagnet to the position of the magnetic flux by the moving member and performing demagnetization by providing the electromagnet with a current signal by control means, the electromagnet can be used both for demagnetization and guiding. Accordingly, it is unnecessary to separately provide a mechanism for demagnetization, and this approach is advantageous from the viewpoint of the cost and the space.

In a magnetic guiding apparatus for guiding a moving member by attracting a target to an electromagnet provided at the moving member, by providing magnetic-flux detection means movable along the target, for detecting a magnetic flux of the target, position measuring means for measuring a position of the magnetic-flux detection means, and control means for detecting a position of the magnetic flux of the target from position information obtained by the position measuring means and magnetic-flux information obtained from the magnetic-flux detection units, and for performing demagnetization at the position of the magnetic flux, it is unnecessary to separately provide a mechanism for measuring the position of the magnetic-flux detection units and a mechanism for detecting the position of the electromagnet, and the position measuring units for the moving member can be utilized. Hence, this configuration is advantageous from the viewpoint of the cost and the space.

By further providing a servo positioning system for positioning the moving member and fixing the position of the moving member by stopping the servo positioning system during the demagnetization, it is possible to perform demagnetization by stabilizing a position to be demagnetized using the electromagnet.

By using at least one of the electromagnets as the magnetic-flux detection unit, it is unnecessary to newly provide a magnetic-flux detector. Hence, this approach is advantageous for reducing the size and the weight of the apparatus.

The individual components shown in outline or designated by blocks in the drawings are all well known in the magnetic guiding apparatus arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A magnetic guiding apparatus for guiding a moving member along a length of a sliding member by attracting a target disposed along the length of the sliding member by electromagnets provided on the moving member, said apparatus comprising:
   a plurality of magnetic-flux detection means, on the guided moving member, for detecting a magnetic flux along the length of the target during movement of the moving member along the length of the sliding member;
   position measuring means for measuring a position of said plurality of magnetic-flux detection means on the guided moving member along the length of the sliding member;
   detection means for detecting a position of the magnetic flux peak along the length of the target, based on output of said plurality of magnetic-flux detection means and said position measuring means; and
   demagnetization means for performing demagnetization at the detected position of the magnetic flux peak.

2. A magnetic guiding apparatus according to claim 1, further comprising storing means for storing the magnetic flux in the target corresponding to the position measured by said position measuring means.

3. A magnetic guiding apparatus according to claim 1, wherein said magnetic-flux detection means is mounted on the moving member.

4. A magnetic guiding apparatus according to claim 3, wherein demagnetization is performed by moving the electromagnets to the position of the magnetic flux and providing the electromagnets with a current signal by said demagnetization means.

5. A magnetic guiding apparatus according to claim 1, wherein at least one of the electromagnets is used as said magnetic-flux detection means.

6. A stage apparatus comprising:
   a magnetic guiding apparatus according to claim 1.

7. An exposure apparatus comprising the stage apparatus of claim 6 for positioning at least one of a substrate and an original.

8. A device manufacturing method comprising:
   providing an exposure apparatus according to claim 7,
   exposing a substrate to a pattern using the exposure apparatus, and
   developing the exposed substrate to manufacture the device.

9. A stage apparatus comprising:
   a target having a length extending along a direction;
   a moving member guided by said target and movable along the length of said target;
   electromagnets provided on said moving member and producing a force between said target and said electromagnets;
   a plurality of magnetic flux detection means provided on the moving member for detecting a magnetic flux during movement of the moving member along the length of said target;
   position measuring means for measuring a position of the magnetic flux detecting means on said moving member along the length of the target; and
   detection means for detecting a position of the magnetic flux peak along the length of the target, based on output of said plurality of magnetic-flux detection means and said position measuring means.

10. A stage apparatus according to claim 9, further comprising demagnetization means for reducing the magnetic flux at the detected position of the magnetic flux peak.

11. A stage apparatus according to claim 10, further comprising a servo positioning system for positioning said moving member, wherein said servo positioning system is off during a reduction in the magnetic flux.

12. A demagnetization method for performing demagnetization of a magnetic guide apparatus, which has a moving member along a length of a target, said method comprising the steps of:
   detecting a magnetic flux along the length of the target by a plurality of magnetic flux detecting means on the moving member during movement of the moving member along the length of the target;
   measuring position of the plurality of magnetic flux detecting means along the length of the target;
   detecting a position of magnetic flux peak along the length of the target based on measured position and detected magnetic flux; and
   performing demagnetization at the detected position of the magnetic flux peak.

13. A magnetic guiding apparatus for guiding a moving member along a length of a beam by attracting a target disposed along the length of the beam by electromagnets provided on the moving member, said apparatus comprising:
   a plurality magnetic-flux detectors, on the guided moving member, configured to detect a magnetic flux along the length of the target during movement of the moving member along the length of the target;
   a position measuring unit configured to measure a position of said plurality of magnetic-flux detectors along the length of the target;
   detection means for detecting a position of a magnetic flux peak along the length of the target, based on output of said plurality of magnetic-flux detectors and said position measuring means; and
   demagnetization means for performing demagnetization at the detected position of the magnetic flux peak.

* * * * *

UNITED STATES PATENT AND TRADEMARK OFFICE
CERTIFICATE OF CORRECTION

PATENT NO. : 7,345,865 B2  Page 1 of 1
APPLICATION NO. : 10/830004
DATED : March 18, 2008
INVENTOR(S) : Asano Tosiya It is certified that error appears in the above-identified patent and that said Letters Patent is hereby corrected as shown below:

ON THE COVER PAGE:
In item "(56) References Cited," under "FOREIGN PATENT DOCUMENTS," the fourth-listed document, "JP  10-244-566  * 9/1998" should read as follows:

-- JP    10-244566    * 9/1998 --.

COLUMN 5:
Line 25, "is" should read -- are --.

COLUMN 8:
Line 17, "is" should read -- are --.

COLUMN 10:
Line 49, "plurality" should read -- plurality of --.

Signed and Sealed this

Thirtieth Day of September, 2008

JON W. DUDAS
*Director of the United States Patent and Trademark Office*